(12) United States Patent
Kodali et al.

(10) Patent No.: US 6,389,577 B1
(45) Date of Patent: May 14, 2002

(54) ANALYZING CMOS CIRCUIT DELAY

(75) Inventors: Visweswara Rao Kodali; Johnny James LeBlanc, both of Austin, TX (US); Kevin William McCauley, Greene, NY (US); Salim Ahmed Shah, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/276,389

(22) Filed: Mar. 25, 1999

(51) Int. Cl.[7] .............................................. G06F 17/50
(52) U.S. Cl. ............................................. 716/4; 716/11
(58) Field of Search ................ 716/18, 11, 4; 703/16

(56) References Cited

U.S. PATENT DOCUMENTS

| | | | | |
|---|---|---|---|---|
| 5,689,432 A | * | 11/1997 | Blaauw et al. ................. | 716/18 |
| 5,903,475 A | * | 5/1999 | Gupte et al. ................... | 703/16 |
| 6,099,581 A | * | 8/2000 | Sakai .......................... | 716/11 |

* cited by examiner

*Primary Examiner*—Matthew Smith
*Assistant Examiner*—Jibreel Speight
(74) *Attorney, Agent, or Firm*—Robert V. Wilder; Casimer K. Salys

(57) ABSTRACT

A method and implementing system is provided in which input signal specifications, element internal delays and output loads, for each element in a circuit design, are utilized in an iterative processing engine to objectively determine and provide a timing rule database for a circuit being designed. A schematic database netlist is run through a test model converter program to provide a test model database at a gate level for the test model design circuit. These data are processed by a designer through a workstation GUI and the result is applied to an I/O design testing function. The results of the I/O design testing function include a listing of patterns of input combinations which are needed to get listed outputs. The GUI prepares a sequence of stimuli to test the circuit with a timing simulator. Based on the output response of the timing simulator, delay relationships under various input and output load conditions are compiled.

7 Claims, 4 Drawing Sheets

ANALYZING CMOS CIRCUIT DELAY

FIELD OF THE INVENTION

The present invention relates generally to circuit design methodology and more particularly to a methodology and implementation for designing integrated circuits.

BACKGROUND OF THE INVENTION

Integrated circuits (ICs) or "chips" are the key components in almost all electronic devices and computer systems on the market. As the state-of-the-art in the design and manufacture of such chips continues to advance, the complexity of the chip-design function is becoming more complex and time consuming. As transistor size decreases, larger levels of integration are possible and more functionality can be built into smaller ICs which take up less space in hardware systems.

The design effort of current state-of-the-art microprocessor chips, for example, has grown exponentially with the complexity of the chips. A current typical design may represent tens of millions of transistors. For these designs to be market competitive, they must also achieve the highest possible clock rate to achieve competitive system operating speeds. Clock speeds of 300 MHz today are not uncommon and the clock rates will continue to increase with improvements in integrated circuit design and manufacturing technologies. The higher clock rates are the product of considerable design manpower and designer skill levels for a given CMOS semiconductor process feature size. A clock rate is the frequency or cycle time that every one of tens of millions of possible circuit logic paths must be fast enough to meet. Any one of these millions of paths can become the limiting factor in the upper clock rate limit, which, in turn, will limit the maximum achievable clock rate for the system and also limit the market value of the entire system design.

In designing integrated circuits, it is essential to find the slowest paths within the integrated circuit, and to modify the design or path to make the path faster, i.e. to reduce the time taken between the receipt of an input to the path and the appearance of a resulting output generated in response to the input. As one circuit path speed is increased, it is no longer the slowest path in the system and efforts are focussed on the next or current "slow path" in the circuit. This iterative process continues until the results are optimized relative to other circuit design criteria. In prior art design techniques, "slow paths" frequently escaped detection and identification and avoided optimization resulting in an inefficient circuit design.

In order to "time out" or measure the timing of circuit paths in new chip designs, the delay of each circuit used in the path must be computed. The method used was to create a delay relationship for the circuit where the delay would vary depending upon how the circuit was used or applied in the particular path being analyzed. This was a commonly used method and was used in order to save manpower since a specific circuit type is used many times on a chip design. Each time the circuit is used, the delay relationship is used to determine a new delay for the circuit depending on certain usage parameters such as "input rise time" and "output loading". Determining the delay relationships within the IC design is quite a sophisticated and complex task and typically requires a massive manpower effort.

Thus, there is a need for an improved methodology and implementing system which is effective to provide improved circuit delay and timing analysis in the design of integrated circuits.

SUMMARY OF THE INVENTION

A method and implementing system is provided in which input specifications, device delays and output loads, for each element in a circuit design, are utilized in an iterative processing engine to objectively determine and provide a timing rule database for a circuit being designed.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

Figure 1:
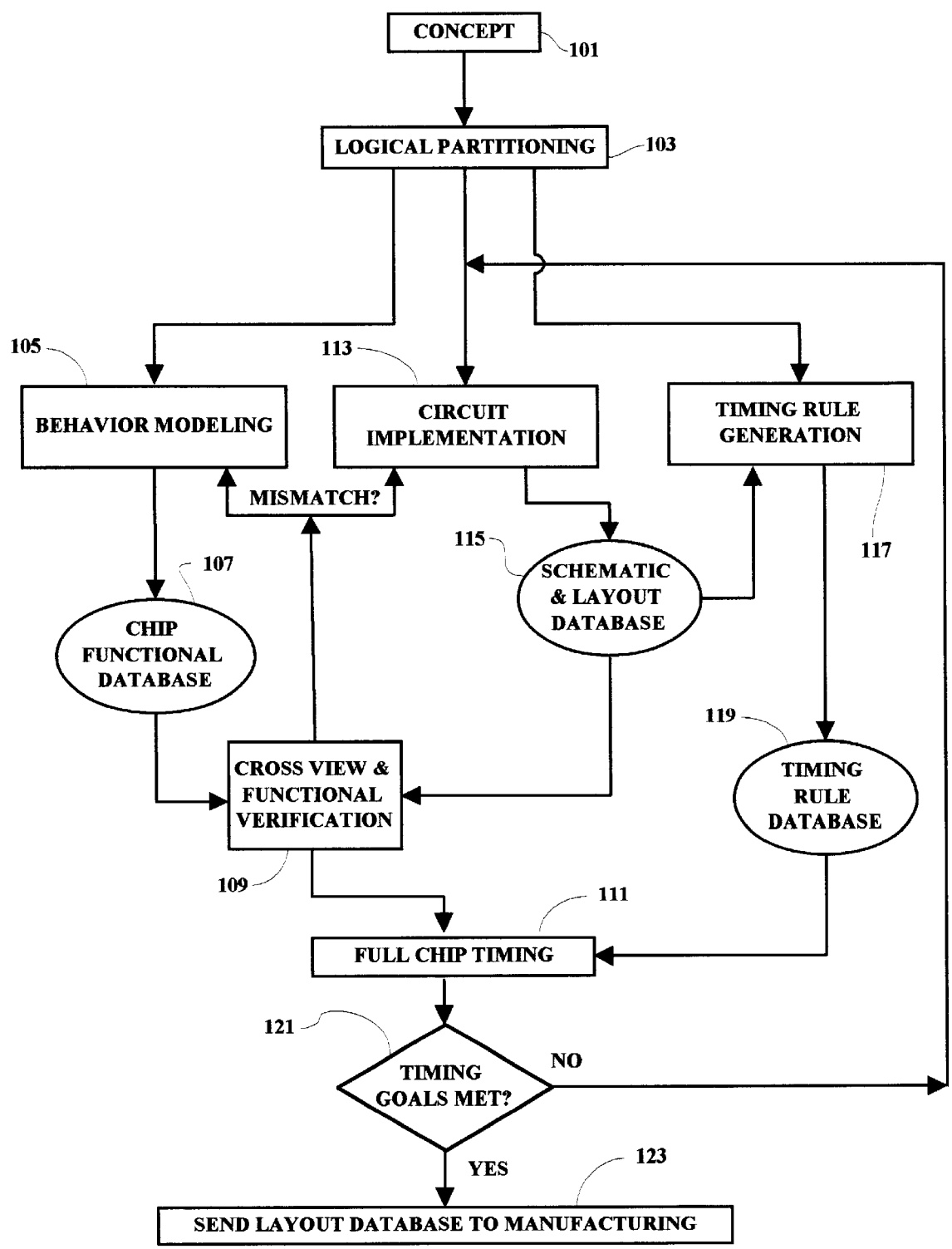
FIG. 1 is a schematic diagram illustrating a typical integrated circuit design process from conception to full chip timing.

The various methods discussed herein may be implemented within a computer workstation which is programmed to accomplished the design and methodology and process steps discussed herein. In FIG. 1, an overall integrated chip design process is illustrated. From an initial requirement, a concept for the design is initiated 101 and the design effort is partitioned into several parallel design efforts including behavioral modeling 105, circuit implementation 113 and full chip timing which requires timing rule generation 117. The behavioral modeling step 105 provides a chip functional database 107 which is used to provide inputs to a cross-view and functional verification step 109. Cross view and functional verifications 109 may drive changes either in the circuit or in the behavioral modeling, and this process is reiterated until there is a full match. Full chip timing 111 is accomplished when there is a full match. The circuit implementation step 113 generates a schematic and layout database 115 which is also applied to the cross-view and functional verification step 109. The schematic and layout database developed from the circuit implementation 113 also provides an input to the timing rule generation step 117, which, in turn, provides a timing rule database 119 for input to the final full chip timing output 111. A check is then made to determine if the IC timing goals have been met 121. If not, the process returns to the circuit implementation step 113. When the IC timing goals have been met 121, the layout database is sent to manufacturing 123.

The timing rule database 119 includes, for each input-output path in a design circuit, a delay characteristic representative of the time delay involved in generating an specific output signal at a specific output terminal of the circuit being designed. For each path, a range of input rise and fall times are included in the database and represent a range of possible rise times and fall times for signals applied to input terminals along with various output loads for the circuit under design. Different circuit delays will be encountered for different rise and fall times of circuit signals. The timing rule database also includes, for each above listing, a range of output loads which may be presented within the circuit being designed.

The output loads will also affect the delay of each logical circuit path. These characteristics of delay, I/O rise/fall times and output loads are repeated for each possible input-output circuit path in the circuit being designed.

Figure 2:
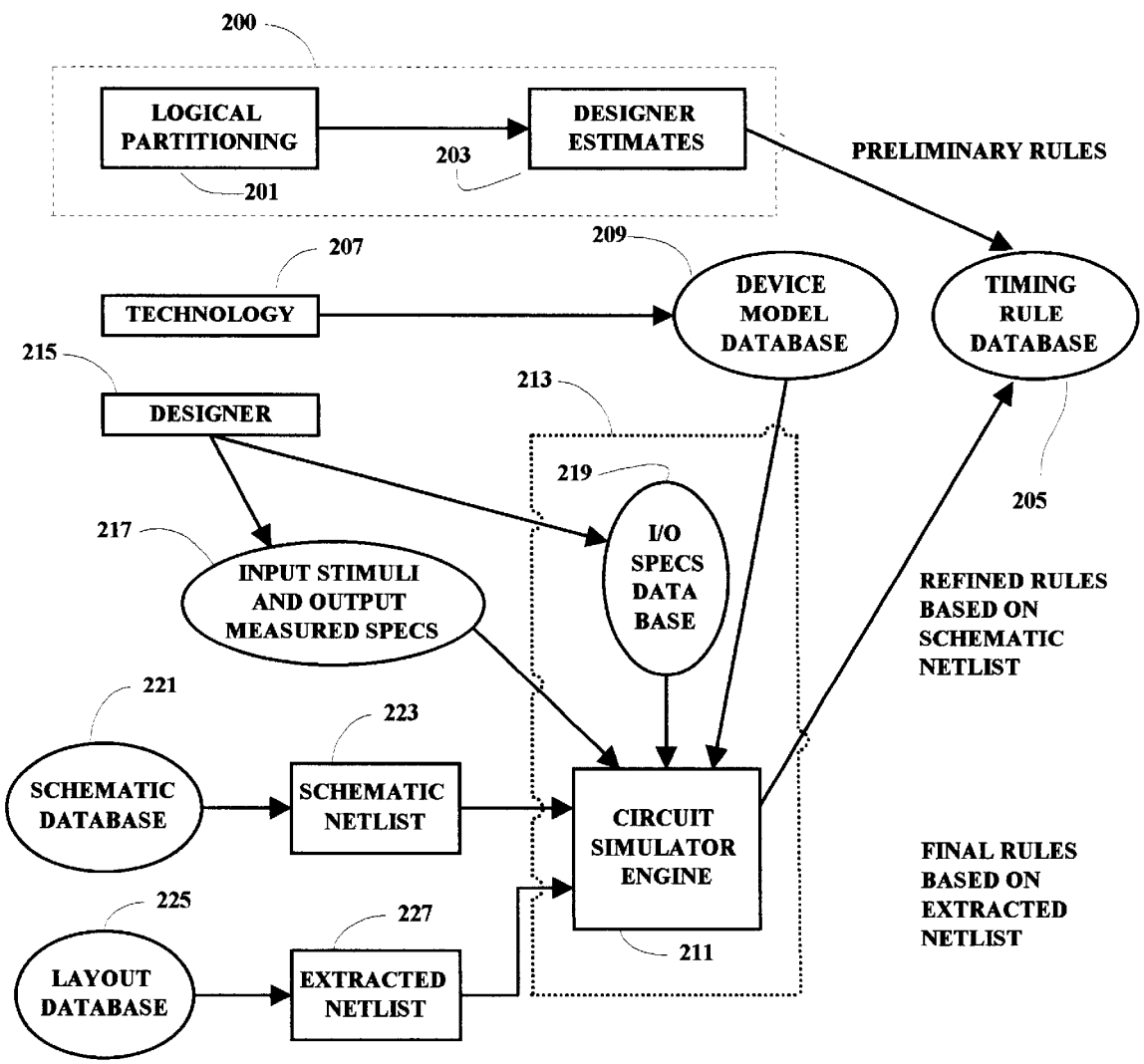
FIG. 2 is a schematic diagram illustrating the timing rule generation portion of the process shown in FIG. 1.

The timing rule generation step 117 of FIG. 1 is shown in more detail in FIG. 2. As shown, a subjective initial design step 200 includes logical partitioning 201 and designer estimates 203 which are an input as preliminary rules to the creation of the timing rule database 205. Through the use of the present invention, these subjective inputs are obviated and the resulting process is much more streamlined and based on objective criteria. As illustrated, the technology 207 will dictate a device model database 209 to be used in the design process. An output from the device model database is input to a circuit simulator engine 211, which processes additional inputs to provide the desired timing rule database 205. The designer 215, by a subjective estimate or "best guess", also initiates the generation of a listing containing circuit input stimuli 217 which is, in turn input to the circuit simulator engine 211. Further, a schematic database 221 is used to provide a schematic netlist 223, and a layout database 225 is used to provide an extracted netlist 227. The schematic netlist or the extracted netlist are also input to the circuit simulator engine 211, and are used in providing the output timing rule database 205.

The schematic database is the repository where the circuit implementation of a logical function is kept. The schematic database includes how the gates or transistors are connected and also contains information concerning the size of the devices to be used. The layout database is the conversion of the schematic database into physical layers and shapes of transistors/gates and the interconnects. The layout database is used to construct the IC in the manufacturing process. The layout database contains the same information as the schematic, and also contains information concerning how the circuit is built and can be used to extract information about the parasitic effects such as the inter-wire relationships when two signals run next to each other. By using the schematic database or connectivity (netlist), the circuit being designed can be simulated without the parasitics. By using the layout database or connectivity, along with parasitics, the most realistic or actual conditions possible can be simulated.

The circuit simulator engine 211 and an I/O specification database 219 together comprise an iterative development program 213 which is operable to provide outputs which comprise the timing rule database 205. The program 213 iterates all supplied input combinations which are effective to provide outputs at given design circuit output terminals. In addition, the program 213 inputs various ranges of the rise times and fall times for each input signal combination, as well as ranges for various possible output loads for each input combination/rise/fall time instance. It is noted that for a design circuit including only thousands of transistors, when a separate instance is tested for each of many possible rise time profiles, and for each of many possible input signal combinations, and for each of many output load situations, the total number of instances or iterations to be tested or run on the iterative development program 213 and the circuit simulator engine 211 may easily accumulate into millions of program input instances or run combinations.

Figure 3:
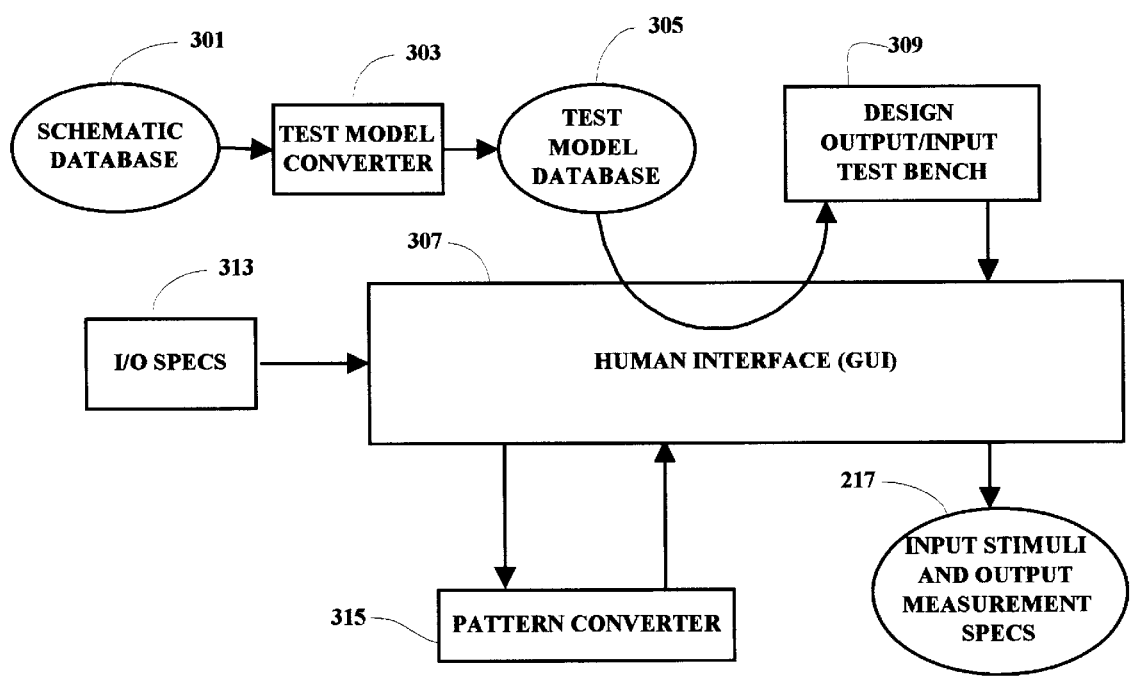
FIG. 3 is a schematic diagram illustrating an input stimuli and output measurement methodology used in accordance with the present invention to replace several of the functions shown in FIG. 2.

In FIG. 3, the methodology illustrated is used to replace blocks 215, 217 and 219 shown in FIG. 2. The output of the disclosed methodology corresponds to the "Input Stimuli and Output Measurement Specification" block 217 in FIG. 2, but, when generated in accordance with the methodology illustrated in FIG. 3, is an objective process and is no longer a "best guess" as was the case in the past. As shown, the schematic database netlist 301, which is a listing of the components and nodes in a model circuit at the transistor level, is run through a test model converter program 303 to provide a test model database 305 at a gate level for the test model design circuit. These data are processed by a designer through a workstation GUI 307 and the result is applied to an I/O design testing function 309. The results of the I/O design testing function 309 include a listing of patterns of input combinations which are needed to get listed outputs. The listing is input for further processing through the GUI 307. The GUI 307 receives the I/O specifications 313 as a range of input rise/fall times along with minimum and maximum load conditions.

A pattern converter 315 is also coupled through the GUI 307. The pattern converter 315 takes the raw information from the design output/input test bench 309 and simplifies the information for testing. Test bench 309 is used for manufacture level testing and the present invention utilizes that output and keeps only what is needed for exercising a timing path. The output of block 217 contains information to excite all possible paths. The designer through the GUI 307 can selectively reduce the pattern set, to minimize the run time, or select one path to represent other similar paths, i.e. "grouping" similar paths into one path. Based on the various objective inputs, the designer is able to provide the Input Stimuli and Output Measurement Specifications 217 for the circuit being designed.

Figure 4:
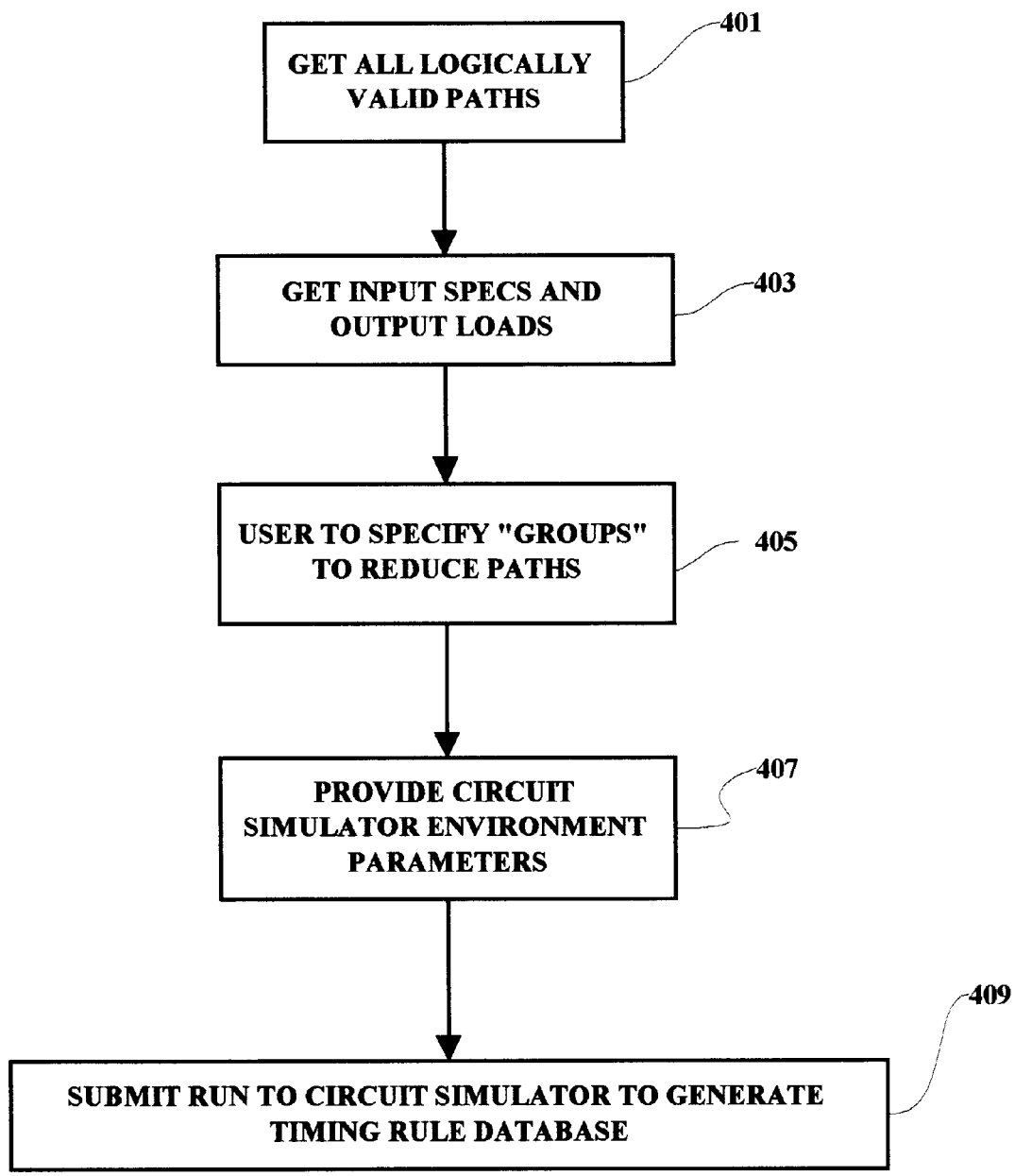
FIG. 4 is a flow chart illustrating an exemplary flow methodology implemented in accordance with the present invention.

The flow chart illustrated in FIG. 4 shows an exemplary embodiment for practicing the methodology of the present invention. As illustrated, the first step gets all logically valid paths 401 within the proposed circuit design (FIG. 3, 309, 307 and 315). These paths include each possible input-to-output path in the circuit. Next, the input specifications and the output loads are gathered 403 (FIG. 3, 313). Next, in the example, the user specifies "groups" to reduce the total number of logically valid paths 405 (FIG. 3, 307 and 315). This step represents a designer trade-off decision between circuit design speed and circuit design test accuracy. "Grouping" refers to a design practice by which many circuit paths through the same gates in a circuit are grouped as one circuit path rather than having separate instances for each such circuit path. This practice reduces input instances and shortens the time necessary for iterative processing in generating the design circuit timing rule database 205. The grouping step may be omitted from the design process if deemed appropriate by the designing entity. Next, the "run" parameters or circuit simulator environment parameters, including such parameters as voltage range, temperature range, etc., are gathered 407 to create the "Input Stimuli and Output Measurement Specifications" 217. The results are submitted 409 to the circuit simulator engine 211 which, in turn, provides the timing rule database 205.

The method and apparatus of the present invention has been described in connection with a preferred embodiment as disclosed herein. The disclosed methodology may be implemented in a wide range of embodiments to accomplish the desired results as herein illustrated. Although an embodiment of the present invention has been shown and described in detail herein, along with certain variants thereof, many other varied embodiments that incorporate the teachings of the invention may be easily constructed by those skilled in the art, and even included or integrated into a processor or CPU or other larger system integrated circuit or chip. The disclosed methodology may also be implemented solely or partially in program code stored on a disk or diskette (portable or fixed), or other memory device, from which it may be executed to achieve the beneficial results as described herein. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for providing a timing rule database for an integrated circuit design, said method comprising:

assembling all logically valid paths for said integrated circuit design;

assembling all input signal specifications for said integrated circuit design, said input signal specifications including rise and fall times of input signals;

providing a circuit simulator process for simulating said integrated circuit design;

applying said input signal specifications to said circuit simulator process, said circuit simulator process being effective for simulating iterative applications of input signals from said input signal specifications to said logically valid paths to provide said timing rule database; and assembling all output load conditions for each node in said integrated circuit design, said output load conditions including minimum and maximum load conditions for each node, said circuit simulator process being effective for simulating said output load conditions in providing said timing rule database.

2. The method as set forth in claim 1 and further including:

combining said logically valid paths in accordance with a predetermined grouping rule to reduce said logically valid paths input to said circuit simulator process.

3. The method as set forth in claim 1 and further including:

providing circuit simulator environment parameters to said circuit simulator process, said circuit simulator process being effective for processing said circuit simulator environment parameters in providing said timing rule database.

4. A method for providing a timing rule database for an integrated circuit design, said method comprising:

providing a schematic database netlist;

processing said schematic database netlist through a test model converter process to provide a test model database; and processing said test model database to provide a listing of patterns of input signal combinations for said integrated circuit design, said input signal combinations being representative of input signals required to obtain specified outputs from said integrated circuit design, said specified outputs including specifications for maximum and minimum load conditions at each node of said integrated circuit design.

5. The method as set forth in claim 4 and further including:

providing a pattern converter interface process, said pattern converter interface process being selectively operable to reduce said listing of patterns.

6. The method as set forth in claim 5 wherein said pattern converter interface process is further selectively operable for minimizing run time for testing said integrated circuit design.

7. The method as set forth in claim 6 wherein said pattern converter interface process is further selectively operable for grouping circuit paths within said integrated circuit design by selecting one path to represent a plurality of similar paths.

* * * * *